United States Patent
Yun et al.

(10) Patent No.: US 7,847,557 B2
(45) Date of Patent: Dec. 7, 2010

(54) BATTERY MANAGEMENT SYSTEM AND METHOD OF DRIVING THE SAME

(75) Inventors: Han-Seok Yun, Yongin-si (KR);
Young-Jo Lee, Yongin-si (KR);
Soo-Seok Choi, Yongin-si (KR);
Jae-Moon Lee, Seoul (KR); Bo-Hyung Cho, Seoul (KR)

(73) Assignee: Samsung SDI Co., Ltd., Yongin-si (KR)

( * ) Notice: Subject to any disclaimer, the term of this patent is extended or adjusted under 35 U.S.C. 154(b) by 422 days.

(21) Appl. No.: 11/846,753

(22) Filed: Aug. 29, 2007

(65) Prior Publication Data

US 2008/0054848 A1    Mar. 6, 2008

(30) Foreign Application Priority Data

Aug. 29, 2006  (KR) .................. 10-2006-0082248

(51) Int. Cl.
*G01N 27/416* (2006.01)
(52) U.S. Cl. .................. 324/430; 324/426; 324/432
(58) Field of Classification Search .................. 324/430
See application file for complete search history.

(56) References Cited

U.S. PATENT DOCUMENTS

| | | | | |
|---|---|---|---|---|
| 6,160,382 | A * | 12/2000 | Yoon et al. .................. | 320/136 |
| 6,687,631 | B2 * | 2/2004 | Yoon et al. .................. | 702/76 |
| 6,737,831 | B2 * | 5/2004 | Champlin .................. | 320/132 |
| 7,518,339 | B2 * | 4/2009 | Schoch .................. | 320/132 |

FOREIGN PATENT DOCUMENTS

| | | |
|---|---|---|
| JP | 2005-221487 | 8/2005 |
| JP | 2006-220629 | 8/2006 |
| KR | 2004-10528 | 1/2004 |
| KR | 2004-72249 | 8/2004 |

* cited by examiner

*Primary Examiner*—Edward Tso
*Assistant Examiner*—Ahmed Omar
(74) *Attorney, Agent, or Firm*—Christie, Parker & Hale, LLP

(57) ABSTRACT

A battery management system that estimates an internal impedance of a battery, a method of driving the same, a device that estimates an internal impedance of a battery, and a method of estimating the internal impedance of a battery. A method of driving a battery management system that estimates the internal impedance of a battery including a plurality of cells includes generating a battery equivalent model of the battery, receiving a terminal voltage signal and a charge and discharge current signal of the battery, and generating a first discrete signal corresponding to the terminal voltage signal of the battery and a second discrete signal corresponding to the charge and discharge current signal of the battery, and filtering the first discrete signal and the second discrete signal according to a frequency range corresponding to the battery equivalent model so as to estimate the internal impedance of the battery. The device that estimates an internal impedance of a battery filters the first discrete signal and the second discrete signal according to a frequency range corresponding to the battery equivalent model so as to estimate the internal impedance of the battery.

8 Claims, 8 Drawing Sheets

BATTERY MANAGEMENT SYSTEM AND METHOD OF DRIVING THE SAME

CROSS-REFERENCE TO RELATED APPLICATIONS

This application claims the benefit of Korean Patent Application No. 2006-82248 filed in the Korean Intellectual Property Office on Aug. 29, 2006, the disclosure of which is incorporated herein by reference.

BACKGROUND OF THE INVENTION

1. Field of the Invention

Aspects of the present invention relate to a battery management system, method, and device. More particularly, aspects of the present invention relate to a method of battery management that can be used on a vehicle that uses electrical energy, a battery management system using the same, and a device to estimate an internal impedance of a battery.

2. Description of the Related Art

Vehicles that use an internal combustion engine, which uses gasoline or diesel oil as fuel, cause environmental pollution, such as air pollution. In order to reduce the amount of environmental pollution, efforts have been made to develop electric vehicles and hybrid vehicles.

An electric vehicle uses a battery engine that is powered by an electrical energy output of a battery. The electric vehicle uses the battery, in which a plurality of rechargeable battery cells are formed into one pack, as a main power source. By using an electric power source and battery engine rather than an internal combustion engine, the electric vehicle does not output exhaust gases and other environmental pollutants.

A hybrid vehicle is a cross between a vehicle using an internal combustion engine and an electric vehicle. The hybrid vehicle uses two or more kinds of power sources. For example, a hybrid vehicle may use both an internal combustion engine and a battery engine. Another type of hybrid vehicle uses both an internal combustion engine and fuel cells that directly obtain electrical energy by a chemical reaction when supplied with reactants such as hydrogen and oxygen. A third type of hybrid car uses a battery engine and fuel cells.

The performance of an electric or hybrid vehicle using electrical energy to power a battery engine is directly affected by the efficiency of the battery. For the battery to operate efficiently, each battery cell needs to have high performance. This requires a battery management system which is capable of efficiently managing the charging and discharging of the battery cells by measuring a voltage of each battery cell, battery voltage, and battery current.

To efficiently charge, discharge, and manage a battery, accurate and timely data on the internal impedance of the battery is required. Accurate internal impedance data is difficult to acquire because the internal impedance of the battery changes according to external and internal conditions, such as temperature, SOC (State of Charge: available output capacity relative to a full charge), battery charge or discharge current, and SOH (State of Health: present performance of the battery, which decreases over its lifetime). Because of the large number of variables required to determine the internal impedance of the battery, it would be very difficult to create an accurate table listing the internal impedance of the battery under all required real world conditions.

The information disclosed in this Background section is only to provide an understanding of the background of the invention and not to establish the current level of the art. The Background section therefore may contain information that is not part of the prior art and is not known to a person of ordinary skill in the art.

SUMMARY OF THE INVENTION

Aspects of the present invention provide a battery management system, a method of driving the same, and a device for estimating an internal impedance of a battery, all of which have the advantage of estimating an internal impedance of a battery in real time.

A first embodiment of the present invention provides a method of driving a battery management system that estimates an internal impedance of a battery including a plurality of cells, the method including generating a battery equivalent model of the battery, receiving a terminal voltage signal and a charge and discharge current signal of the battery, generating a first discrete signal corresponding to the terminal voltage of the battery signal, generating a second discrete signal corresponding to the charge and discharge current signal of the battery, and estimating the internal impedance of the battery by filtering the first discrete signal and the second discrete signal according to a frequency range corresponding to the battery equivalent model. The estimating of the internal impedance of the battery further includes generating a third discrete signal by filtering the first discrete signal according to the frequency range corresponding to the battery equivalent model, and generating a fourth discrete signal by filtering the second discrete signal according to the frequency range corresponding to the battery equivalent model. The estimating of the internal impedance of the battery may include using a bilinear conversion method to generate the first to fourth discrete signals. The generating of the battery equivalent model of the battery further includes calculating a first parameter, which represents a resistance overvoltage corresponding to the internal impedance of the battery; calculating a second parameter which represents a charge transfer overvoltage, calculating a third parameter, which represents a diffusion overvoltage; and calculating a fourth parameter, which represents an open circuit voltage. The battery equivalent model includes a first capacitor and a first resistor connected in parallel to represent a charge transfer impedance of the battery, a second capacitor and a second resistor connected in parallel to represent a diffusion impedance of the battery, a third resistor to represent a series resistance impedance of the battery, and a open circuit voltage component to represent a open circuit voltage of the battery. The first to fourth parameters may be divided according to a frequency domain. Further, the estimating of the internal impedance of the battery by filtering the first discrete signal and the second discrete signal according to the frequency range corresponding to the battery equivalent model may include filtering the first parameter by using a high-pass filter, filtering the second parameter by using a band-pass filter, and filtering the third and fourth parameters by using a low-pass filter. Alternatively, the method may further include filtering the second parameter by using a low-pass filter instead of a band-pass filter. The method may further include estimating the first to fourth parameters by using the third discrete signal and the fourth discrete signal, and estimating a resistor and a capacitor that correspond to the internal impedance of the battery by using the four parameters. Additionally, the first to fourth parameters can be estimated by using a least square estimation method.

A second embodiment of the present invention provides a battery management system that estimates the internal impedance of a battery including a plurality of cells, the system including an anti-aliasing low-pass filter that receives a battery terminal voltage signal and a battery terminal current signal and removes aliasing of the battery terminal voltage signal and the battery terminal current signal so as to generate a first signal and a second signal, a continuous/discrete signal converter that converts the first signal and the second signal into discrete signals according to a sampling time, and thereby generates a first discrete signal corresponding to the first signal and a second discrete signal corresponding to the second signal, and an impedance estimating unit that estimates the internal impedance of the battery by filtering the first and the second discrete signals according to a frequency range corresponding to a battery equivalent model of the battery. The impedance estimating unit may further generate a third discrete signal by filtering the first discrete signal and a fourth discrete signal by filtering the second discrete signal according to the frequency range corresponding to the battery equivalent model of the battery, and estimate the internal impedance of the battery by using the third discrete signal and the fourth discrete signal. Further, the battery equivalent model may include four parameters, each of which corresponds to the internal impedance of the battery, the four parameters including a first parameter, which represents a resistance overvoltage, a second parameter, which represents a charge transfer overvoltage, a third parameter, which represents a diffusion overvoltage, and a fourth parameter, which represents an open circuit voltage. The first to fourth parameters may be divided according to a frequency domain. Further, the impedance estimating unit may filter the first parameter by using a high-pass filter, the second parameter by using a band-pass filter, and the third and fourth parameters by using a low-pass filter. Further, the impedance estimating unit may estimate the four parameters by using the third discrete signal and the fourth discrete signal, and estimate a resistor and a capacitor that correspond to the internal impedance of the battery using the four parameters.

A third embodiment of the present invention provides a device that estimates an internal impedance of a battery including a plurality of cells, which includes a low-pass filter to filter a first discrete signal corresponding to a terminal voltage of the battery and a second discrete signal corresponding to a charge and discharge current of the battery, and thereby obtain a diffusion overvoltage, a charge transfer current, and an open circuit voltage of the battery, a high-pass filter to filter the first discrete signal and the second discrete signal and thereby obtain a resistance overvoltage and a resistance current of the battery. The device may further include a band-pass filter to filter the first discrete signal and the second discrete signal and thereby obtain a charge transfer overvoltage of the battery. The device may further include a low-pass filter to filter the first discrete signal and the second discrete signal and thereby obtain a charge transfer overvoltage of the battery. The low-pass filter and the high-pass filter may be digital filters. The device may further include a calculation unit to estimate the internal impedance of the battery by using the overvoltages and the currents obtained by filtering the first discrete signal and the second discrete signal. The calculation unit of the device may further use a least square method to estimate the internal impedance of the battery by using the overvoltages and the currents obtained by filtering the first discrete signal and the second discrete signal. Further still, the calculation unit of the device may determine the diffusion overvoltage, the charge transfer current, the open circuit voltage, the resistance overvoltage, the resistance current of the battery, the charge transfer overvoltage, and the charge transfer current of the battery by using the internal impedance of the battery.

A fourth embodiment of the present invention provides a method for estimating an internal impedance of a battery. The method includes generating a battery equivalent model of the battery, measuring a battery terminal voltage, measuring a battery charge and discharge current when the battery is charged and discharged, using the battery terminal voltage and the battery charge and discharge current to calculate the value of parameters of the battery equivalent model, and estimating the internal impedance of the battery from the parameters of the battery equivalent model. In the method of estimating the internal impedance of a battery, the battery equivalent model may be divided into a charge transfer resistance of the battery, a diffusion impedance of the battery, a series resistance of the battery, and an open circuit voltage of the battery. The battery equivalent model may include a first capacitor and a first resistor connected in parallel to represent the charge transfer resistance of the battery, a second capacitor and a second resistor connected in parallel to represent the diffusion impedance of the battery, a third resistor to represent the series resistance of the battery, and an open circuit voltage component to represent the open circuit voltage of the battery. The method may further include dividing the battery terminal voltage measurement and the battery charge and discharge current measurement into frequency ranges corresponding to the charge transfer resistance of the battery, the diffusion impedance of the battery, the series resistance of the battery, and the open circuit voltage of the battery.

Additional aspects and/or advantages of the present invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the embodiments, taken in conjunction with the accompanying drawings of which.

DETAILED DESCRIPTION OF THE EMBODIMENTS

Figure 1:
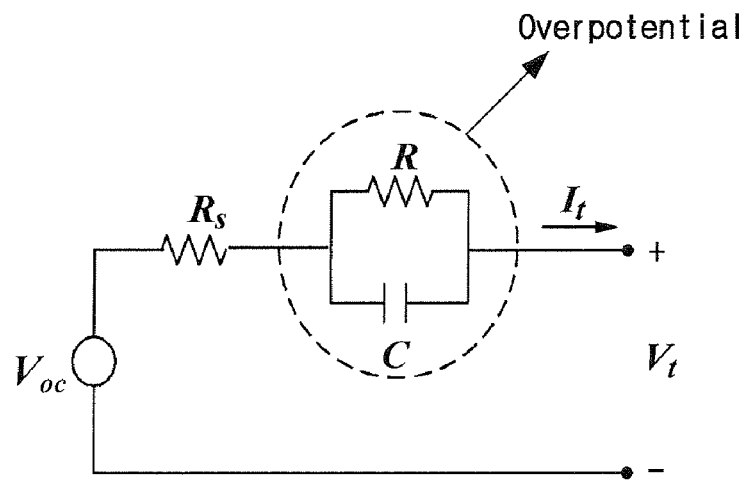
FIG. 1 is an equivalent circuit diagram of a basic model of a battery.

Reference will now be made in detail to embodiments of the present invention, examples of which are illustrated in the accompanying drawings, wherein like reference numerals refer to the like elements throughout. The embodiments are described below in order to explain the present invention by referring to the figures.

FIG. 1 is an equivalent circuit diagram illustrating a basic model of a battery. In FIG. 1, $V_{OC}$ indicates an open circuit voltage (OCV). $R_s$ is an equivalent series resistance and indicates a resistance component of an electrolyte and battery plates in the battery. The resistance $R_s$ has a large value at a high SOC (state of charge) during the charge cycle and at a low SOC during the discharge cycle. The resistance $R_s$ has a constant value at the SOC of the other situations (e.g., low SOC during the charge cycle). An overpotential portion that is represented by R-C (resistor-capacitor) connected in parallel represents polarization of the battery when it is being charged and discharged. $V_t$ represents the voltage at the terminals of the battery, and $I_t$ represents the direction of current flow through the battery.

Figure 2:
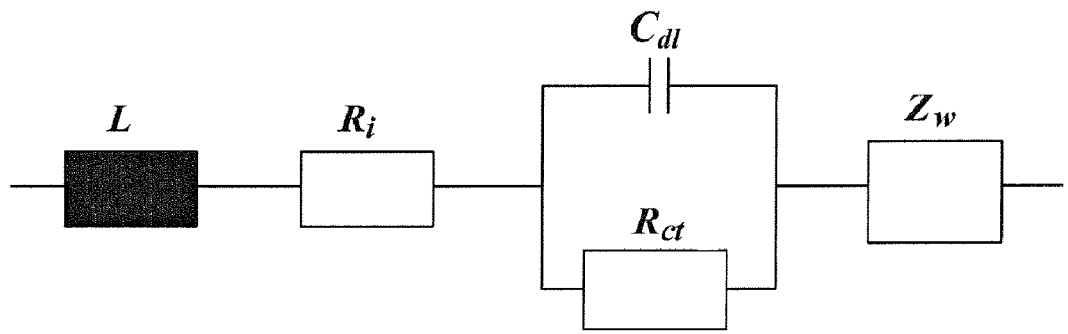
FIG. 2 is an equivalent circuit diagram of a battery that incorporates electrochemical characteristics of the battery.

FIG. 2 is an equivalent circuit diagram of a battery which includes electrochemical characteristics of the battery. As shown in FIG. 2, the equivalent circuit diagram of the battery includes the elements of an internal resistance $R_i$, a charge transfer resistance $R_{ct}$, a double layer capacitance $C_{dl}$, a diffusion impedance $Z_w$, and a parasitic inductance L. The double layer capacitance $C_{dl}$ and the diffusion impedance $Z_w$ are both constant phase elements in a frequency domain.

In the equivalent circuit diagram shown in FIG. 2, the parasitic inductance L and the internal resistance $R_i$ are functions of the SOC and the SOH of the battery. The internal resistance $R_i$ increases after strong discharge and returns to a lower value after an idle period. The idle period (rest time) is a time required for voltage to stabilize after the battery is strongly charged or discharged. When the internal resistance $R_i$ satisfies the conditions of float charge and constant current after the idle period (has stabilized from the rest time), it is possible to directly measure the SOC and the SOH by using the ohmic resistance of the internal resistance $R_i$. The internal resistance $R_i$ changes with respect to the SOC because conductivity of the electrolyte changes according to the SOC. This change of the conductivity of the electrolyte causes non-linearity of the characteristics of the battery. The value of the internal resistance $R_i$ and the parasitic inductance L decrease as the pressure of the battery plates increases.

Double layer capacitance has a property of having a predetermined phase in a frequency domain. In order to represent the double layer capacitance with a phase component in a time domain, the double layer capacitance is modeled by a plurality of resistance-capacitance ladders (with one ladder shown in FIG. 2) including the charge transfer resistance $R_{ct}$. The greater the number of resistance-capacitance ladders used, the more accurate the model is, but the greater the number of calculations required.

The value of the charge transfer resistance $R_{ct}$ is another non-linear characteristic of the battery. The voltage at both ends of the charge transfer resistor $R_{ct}$ is saturated at a predetermined current value or more, similar to a current versus voltage curve of a diode.

The diffusion impedance $Z_w$, indicates a property of a constant phase element (CPE) that has a predetermined phase in the frequency domain. The diffusion impedance $Z_w$ can be more accurately represented by a series of resistance-capacitance ladders.

Figure 3:
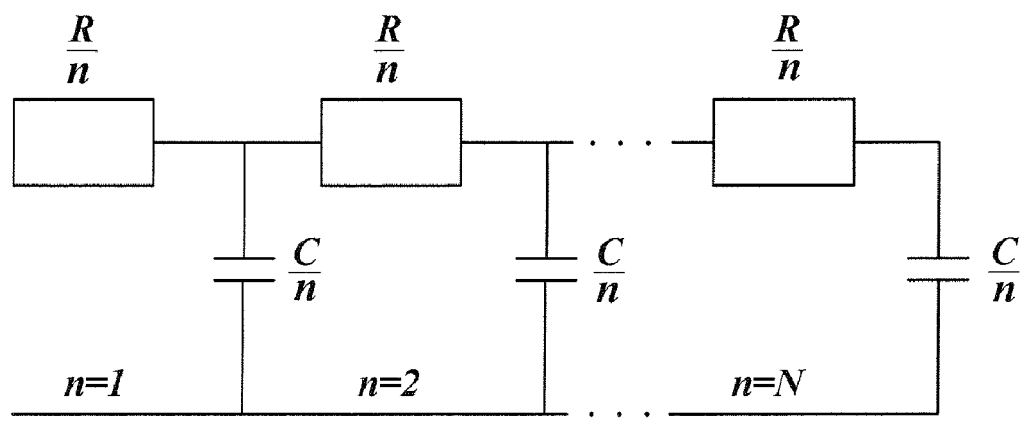
FIG. 3 is a diagram illustrating the diffusion impedance Zw of FIG. 2 in a battery equivalent circuit by using resistance-capacitance ladders.

FIG. 3 is a diagram illustrating the diffusion impedance $Z_w$ in a battery equivalent circuit diagram by using resistance-capacitance ladders. As shown in FIG. 3, the diffusion impedance is represented as N resistors of a value of R/n that are connected in series, and N capacitors of a value of C/n that are connected in parallel to each other at the nodes where the resistors are joined.

Figure 4:
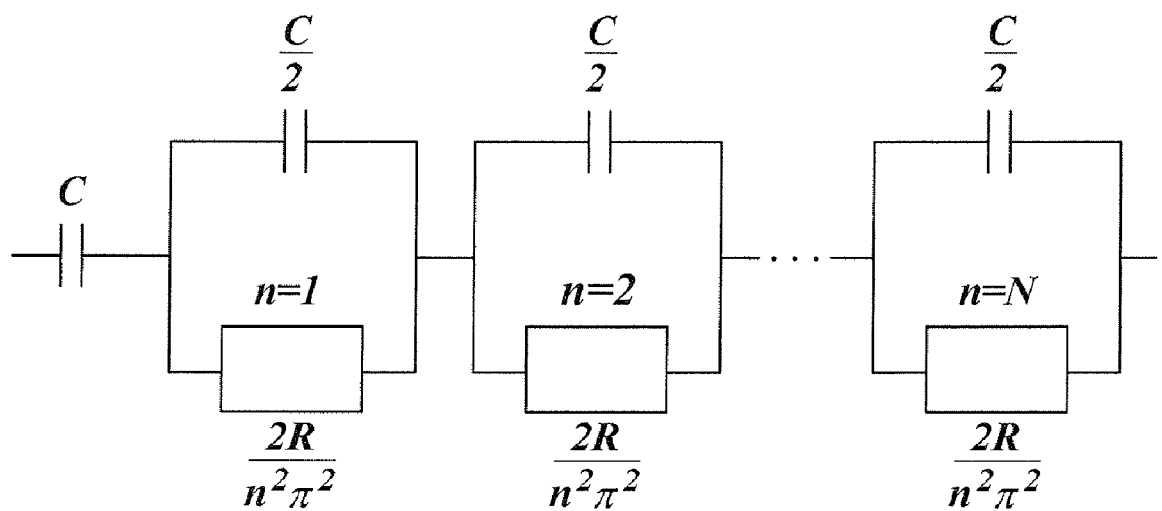
FIG. 4 is a diagram illustrating an equivalent circuit model that includes the diffusion impedance Zw and an open circuit voltage OCV in a time domain.

FIG. 4 is a diagram illustrating an equivalent circuit modeled including the diffusion impedance $Z_w$ and the open circuit voltage OCV in a time domain. The equivalent circuit shown in FIG. 4 is generated by modeling a reaction of the battery equivalent circuit diagram of FIGS. 2 and 3 to an impulse response.

As shown in FIG. 4, the equivalent circuit model represents the diffusion impedance ZW and the open circuit voltage OCV in a time domain by using a capacitor C and N impedances connected in series. Each of the impedances includes a resistor $2R/n^2\pi^2$ and a capacitor $C/2$ connected in parallel. The number N may be infinite, and the larger the value of N the more accurate the model is, but the greater the number of calculations that are required. As the number of resistance-capacitance ladders increases, for each new ladder the size of the capacitance is maintained at $C/2$ and the size of the resistance decreases towards zero.

An equivalent circuit model of the battery incorporating the elements of FIGS. 1 through 4 represents physical characteristics of the battery, and by using the equivalent circuit model, it is possible to estimate the internal characteristics of the battery, characteristics that may be difficult to measure directly. Further, since the battery has complicated electrochemical and non-linear characteristics, it is possible to estimate the SOC or the SOH by using the equivalent circuit model of the battery rather than by using a table, the table being difficult to generate due to the number of variables involved, as discussed above.

A battery management system, a method of driving the same, and a device for estimating an internal impedance of a battery, according to an embodiment of the present invention, determine the internal impedance of a battery by using values from an equivalent circuit model of the battery and dividing the values by a frequency.

The battery model is divided into a series resistance region, a charge transfer resistance region, a diffusion region, and an open circuit voltage region. In the series resistance region, an instantaneous voltage drop of the battery occurs. In the charge transfer resistance region and the diffusion region, a decrease in voltage of the battery occurs according to a characteristic of $$e^{-\frac{t}{RC}}.$$

In the charge transfer region of the battery, parameters of the battery (resistance and capacitance) can be measured by using EIS (Electrochemical Impedance Spectroscopy). In the diffusion region of the battery, the parameters (resistance and capacitance) can be measured by using a step response method. In the step response method, the parameter is measured by measuring a voltage reaction of the battery to a step current. By using the size of current, the parameters can be estimated.

The EIS (Electrochemical Impedance Spectroscopy) method is more complicated but a more accurate method than the step response method. In EIS, the internal impedance of the battery is measured by using EIS equipment that measures the current (or alternatively, the voltage) of the battery with respect to voltages (or alternatively, the currents) of different frequencies.

In EIS, independent determination of each of the characteristics of the battery, that is, diffusion impedance $Z_w$, charge transfer resistance $R_{ct}$, and double layer capacitance $C_{dl}$ is possible. Through the analysis, it is possible to obtain the parameters of the equivalent circuit of the battery. The step response method is not preferable to EIS because the step response method charges and discharges the battery several times, which causes aging of the battery, lowering its SOH. By using EIS, it is possible to extract the parameters of the battery without causing wear to the battery and affecting the SOH of the battery.

The EIS method includes two types of methods. One is a potentiostatic method and the other is a galvanostatic method. In the potentiostatic method, a direct voltage and an alternating voltage (DC_V+ac_v) are applied as inputs to the battery and an output current (DC_A+ac_a) is measured. The impedance is obtained by using Equation 1.

$$\text{impedance} = \frac{ac\_v}{ac\_a} \quad \text{Equation 1}$$

In the galvanostatic method, a direct current and an alternating current (DC_A+ac_a) are applied as inputs to the battery, and an output voltage (DC_V+ac_v) is measured. Similar to Equation 1, the impedance is obtained by dividing the measured voltage by the applied current.

When the parameters of the equivalent circuit of the battery are obtained using EIS equipment, all four regions of the battery appear, and thus the parameters of each of the regions can be obtained. Of the two above-described methods, an embodiment of the present invention uses the potentiostatic method in order to measure the internal impedance of the battery.

In order to determine a characteristic curve of the battery, both a low-frequency domain and a high-frequency domain of the battery need to be considered. In the characteristic curve of the battery, the high-frequency domain is the charge transfer region, and the low-frequency domain is the diffusion region. The SOC of a battery divided at intervals of 10% and a potential of the SOC at the corresponding intervals is shown as Table 1. The potential below corresponds to an open circuit voltage OCV of one cell.

TABLE 1

| SOC 70% | SOC 60% | SOC 50% | SOC 40% | SOC 30% | SOC 20% | SOC 10% |
|---------|---------|---------|---------|---------|---------|---------|
| 3.961 V | 3.833 V | 3.818 V | 3.735 V | 3.635 V | 3.549 V | 3.474 V |

Temperature: 25 Degrees Celsius

Frequency Range (for 4 minutes and 7 seconds): 100 KHz to 50 mHz

Number of Measurements: 20 for $\geq$66 Hz; 5 for <66 Hz

Steps per Decade (Number of Measurements): $\geq$66 Hz (15), <66 Hz (4)

Unit of Sweep: 5 mV

Figure 9:
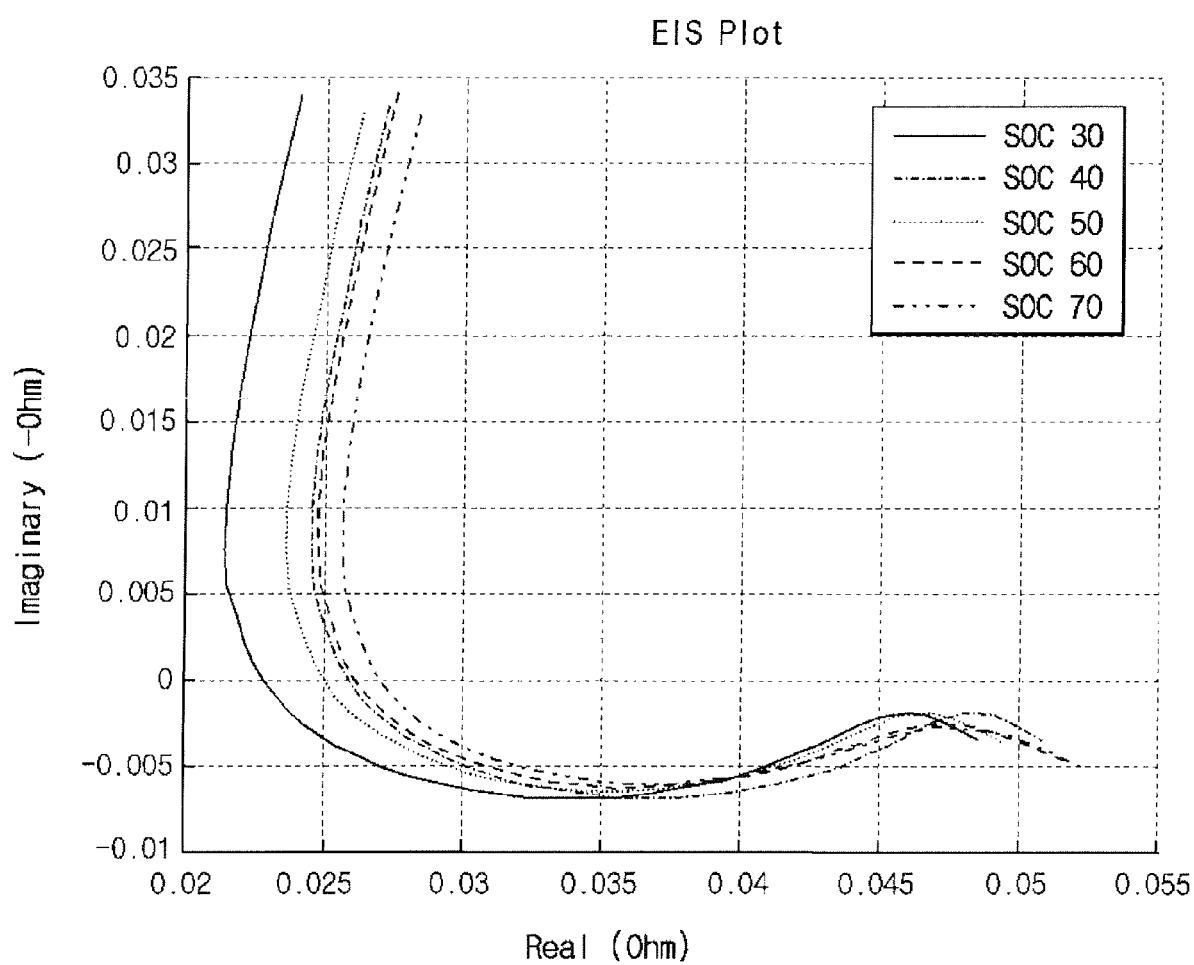
FIG. 9 is a graph showing a horizontal axis indicating a real resistance component of the internal impedance of the battery, and a vertical axis indicates an imaginary resistance component of the internal impedance of the battery.

A result of an experiment conducted under the conditions described above using a battery is shown in FIG. 9. In FIG. 9, a horizontal axis indicates a real resistance component of the internal impedance of the battery, and a vertical axis indicates an imaginary resistance component of the internal impedance of the battery.

In FIG. 9, the portion curved in a semicircle corresponds to the charge transfer region, and a straight line (with a slope of approximately −45 degrees) corresponds to a portion where the diffusion region begins.

As the result of the experiment, the battery resistance (series resistance) is shown to only slightly change according to the current and the SOC, and the parameter of the charge transfer region also only slightly changes according to the current and the SOC.

Hereinafter, referring to FIGS. 5 to 8, a battery management system, a method of driving the same, and a device for estimating an internal impedance of a battery, according to an embodiment of the present invention, will be described in detail.

A battery management system, a method of driving the same, and a device for estimating an internal impedance of a battery, according to an embodiment of the present invention, use parameters of the battery and an equivalent circuit model of the battery to estimate overvoltages, and measure voltage and current when the charging and discharging of the battery occur so as to estimate internal impedance of the battery. Further, filters through which the parameters of the battery are divided corresponding to the series resistance region, the charge transfer resistance region, the diffusion region, and the open circuit voltage region are used to estimate the internal impedance of the battery.

First, the equivalent circuit model shown in FIG. 2 is modified into a battery equivalent circuit model for estimating battery equivalent circuit parameters.

Figure 5:
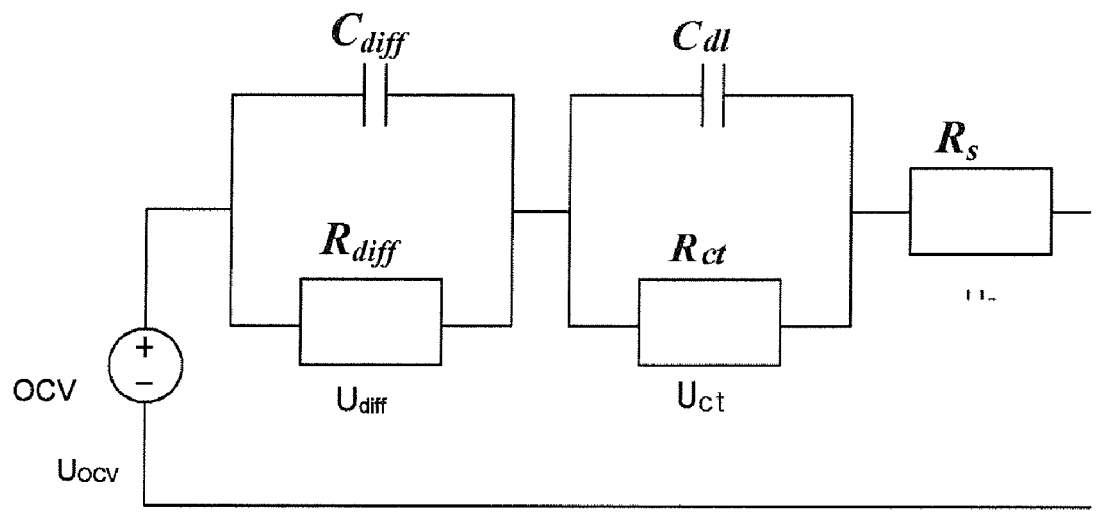
FIG. 5 is a diagram illustrating a battery equivalent circuit model, according to an embodiment of the present invention.

FIG. 5 is a diagram illustrating a battery equivalent circuit model according to an embodiment of the present invention. The charge transfer impedance from FIG. 2 is represented in FIG. 5 by a parallel circuit of the resistor $R_{ct}$ and the capacitance $C_{dl}$. Further, the diffusion impedance $Z_w$ from FIG. 2 is represented in FIG. 5 by a parallel circuit of a resistor $R_{diff}$ and a capacitor $C_{diff}$. In addition, a series resistance component $R_s$ and an open circuit voltage component OCV are included.

As shown in FIG. 5, the battery equivalent circuit model is divided into overvoltage regions according to the structure of the internal impedance. The overvoltage regions include a resistance overvoltage $U_s$ region for the series resistance region, a charge transfer overvoltage $U_{ct}$ region for the charge transfer region, a diffusion overvoltage $U_{diff}$ region for the diffusion region, and an open circuit voltage (OCV) $U_{OCV}$ region for the open circuit voltage region.

Figure 7:
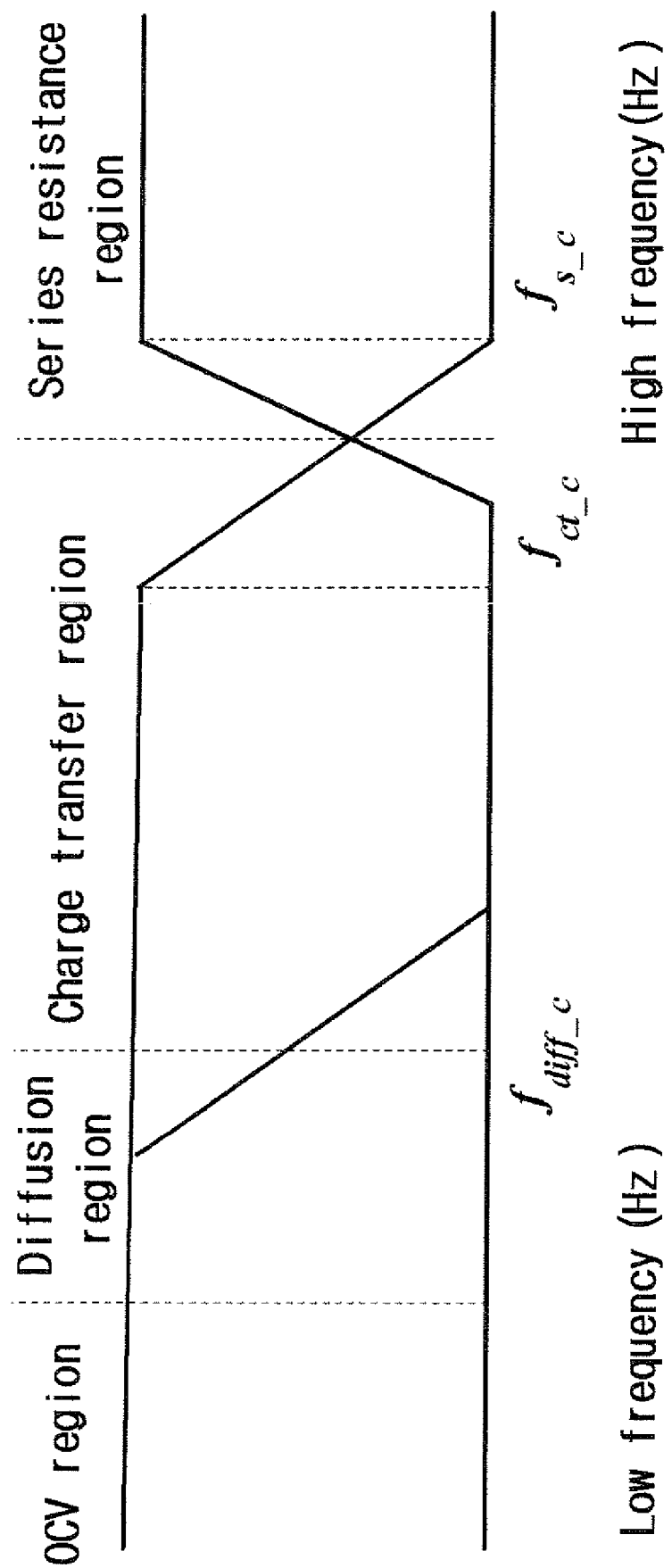
FIG. 7 is a diagram illustrating a frequency domain corresponding to four regions of a battery equivalent circuit model, according to an embodiment of the present invention.

The battery management system according to an embodiment of the present invention divides the four regions in the frequency domain (as shown in FIG. 7 and described below). The battery management system divides charge and discharge current of the battery and battery voltage by using filters. The divided voltage and current are used to obtain the internal impedance of the battery in each of the four regions.

First, a method of estimating the parameters of the battery and the overvoltages in the battery equivalent model by measuring the charge and discharge current and the voltage of the battery will be described.

Figure 6:
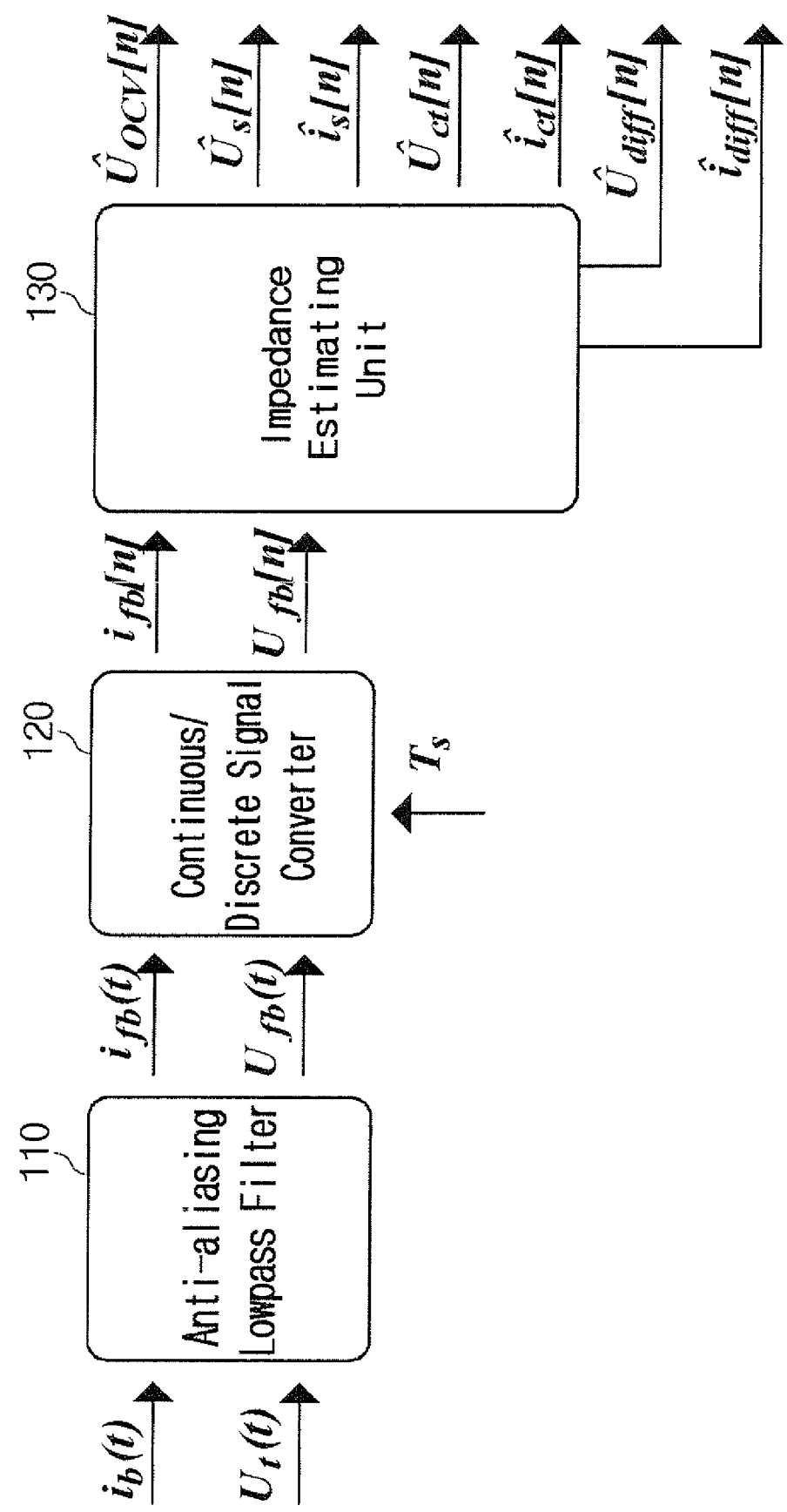
FIG. 6 is a diagram illustrating a battery management system, according to an embodiment of the present invention.

FIG. 6 is a diagram illustrating a battery management system according to an embodiment of the present invention. FIG. 7 is a diagram illustrating a frequency domain corresponding to each component.

In FIG. 6, the battery management system includes an anti-aliasing low-pass filter 110, a continuous/discrete signal converter 120, and an impedance estimating unit 130. The battery management system estimates the internal impedance by applying digital filters to discrete signals generated from measured continuous time domain signals.

The anti-aliasing low-pass filter 110 removes aliasing in a continuous time domain and converts the de-aliased signal into a discrete signal. In signal processing when a signal during a predetermined continuous time is converted into a discrete signal, aliasing occurs if the signal is sampled at a lower frequency than the frequency that the signal has during the predetermined continuous time. As an example, when a hybrid vehicle travels, components of the charge and discharge current and the voltage of the battery are analyzed using a FFT (Fast Fourier transform) method, and this method results in aliasing. In this analysis, components above a predetermined frequency are not analyzed. In the present exemplary embodiment, the following description assumes that components above a frequency of 500 Hz are not described or shown. The anti-aliasing low-pass filter 110 sets the upper limit of each of the signals of the battery voltage $U_t(t)$ and the charge and discharge current $i_b(t)$ at 500 Hz. In order to remove aliasing, noise or signals above 500 Hz are removed by using a low-pass filter.

The continuous/discrete signal converter 120 samples the charge and discharge current $i_{fb}(t)$ and the battery voltage $U_{fb}(t)$, from which noise or signals above 500 Hz were removed by the anti-aliasing low-pass filter 110, at predetermined time intervals $T_s$ (sampling time), so as to generate discrete signals for the charge and discharge current $i_{fb}[n]$ and the battery voltage $U_{fb}[n]$.

The impedance estimating unit 130 divides the charge and discharge current $i_{fb}[n]$ and the battery voltage $U_{fb}[n]$ by using a low-pass filter, a high-pass filter. Further, the impedance estimating unit 130 generates an OCV voltage $\hat{U}_{OCV}[n]$, a resistance overvoltage $\hat{U}_s[n]$, a charge transfer overvoltage $\hat{U}_{ct}[n]$, a diffusion overvoltage $\hat{U}_{diff}[n]$, a resistance current $\hat{i}_s[n]$, a charge transfer current $\hat{i}_{ct}[n]$, and a diffusion current $\hat{i}_{diff}[n]$ according to a frequency range (see FIG. 7). Specifically, the impedance estimating unit 130 uses the high-pass filter in order to obtain the resistance overvoltage $\hat{U}_s[n]$ and the resistance current $\hat{i}_s[n]$, and uses a band-pass filter in order to obtain the charge transfer overvoltage $\hat{U}_{ct}[n]$ and the current $\hat{I}_{ct}[n]$. Further, the low-pass filter is used to obtain the diffusion overvoltage $\hat{U}_{diff}[n]$, the charge transfer current $\hat{I}_{diff}[n]$, and the OCV voltage $\hat{U}_{OCV}[n]$ Even though the band-pass filter could obtain the charge transfer overvoltage $\hat{U}_{ct}[n]$ and the current $\hat{I}_{ct}[n]$, the impedance estimating unit 130, according to an embodiment of the present invention, uses the low-pass filter instead of the band-pass filter so as to obtain the charge transfer overvoltage $\hat{U}_{ct}[n]$ and remove the diffusion overvoltage $\hat{U}_{diff}[n]$. This is because a boundary between the charge transfer overvoltage $\hat{U}_{ct}[n]$ and the diffusion overvoltage $\hat{U}_{diff}[n]$ changes according to the current SOC, and the boundary changes according to a direct bias current flowing through the battery. By using the low-pass filter in this way, a cutoff frequency does not need to be changed according to the SOC or the flowing direct bias current when filtering the charge transfer overvoltage $\hat{U}_{ct}[n]$ The impedance estimating unit 130, according to an embodiment of the present invention, uses a first low-pass filter and a first high-pass filter for the simplicity of the implementation.

Transfer functions of the first low-pass filter and the first high-pass filter in the continuous time domain are represented by Equation 2 and Equation 3.

$$\text{First low-pass filter: } H_{lp}(S) = \frac{1}{s/\omega_c + 1} \qquad \text{Equation 2}$$

-continued $$\text{First high-pass filter: } H_{hp}(S) = \frac{s}{s + \omega_c} \qquad \text{Equation 3}$$

Where $\omega_c$ is a cutoff frequency.

The continuous/discrete signal converter 120 converts the transfer functions in the continuous time domain into transfer functions in a discrete domain. Three types of conversion methods are generally used for this type of conversion. The methods are a bilinear conversion, a backward conversion, and a forward conversion. The continuous/discrete signal converter 120, according to an embodiment of the present invention, uses the bilinear conversion method. Conversion formulas are shown in Equation 4.

$$s = \frac{2}{T_s} \cdot \frac{1 - Z^{-1}}{1 + Z^{-1}} \qquad \text{Equation 4}$$

$$H_{lp}(z^{-1}) = H_{lp}\left[\frac{2}{T_s} \cdot \frac{1 - Z^{-1}}{1 + Z^{-1}}\right]$$

$$H_{hp}(z^{-1}) = H_{hp}\left[\frac{2}{T_s} \cdot \frac{1 - Z^{-1}}{1 + Z^{-1}}\right]$$

$U_{raw}$ represents the battery voltage signal $U_{fb}[n]$ signal or the charge and discharge current $i_{fb}[n]$ signal from the continuous/discrete signal converter 120. The impedance estimating unit 130 performs low-pass filtering on $U_{raw}$ to generate $\hat{U}_{FLT\_raw}$, as shown in Equation 5.

$$\hat{U}_{FLT\_raw}[n] = \qquad \text{Equation 5}$$

$$lp_1 * \hat{U}_{FLT\_raw}[n-1] + lp_2 * (U_{raw}[n-1] + U_{raw}[n])$$

Here, $$\omega_c = 2\pi \cdot f_c,$$

$$lp_1 = \frac{\frac{2}{\omega_c} - T_s}{\frac{2}{\omega_c} + T_s},$$

and $$lp_2 = \frac{T_s}{\frac{2}{\omega_c} + T_s} \text{ are satisfied.}$$

Additionally, the impedance estimating unit 1130 performs high-pass filtering on $U_{raw}$ as shown in Equation 6 so as to generate $\hat{U}_{FLT\_raw}$.

$$\hat{U}_{FLT\_raw}[n] = \qquad \text{Equation 6}$$

$$hp_1 * \hat{U}_{FLT\_raw}[n-1] + hp_2 \cdot (U_{raw}[n] - U_{raw}[n-1])$$

At this time, $$\omega_c = 2\pi \cdot f_c,$$

$$hp_1 = \frac{\frac{2}{\omega_c} - T_s}{\frac{2}{\omega_c} + T_s},$$

and

-continued $$hp_2 = \frac{T_s}{\frac{2}{\omega_c} + T_s} \text{ are satisfied.}$$

In this way, the battery terminal voltage $U_{raw}$ is subjected to the filtering and divided into overvoltages as shown in Equation 7.

$$U_{s\_raw} = U_t - \hat{U}_{ocv} - \hat{U}_{ct} - \hat{U}_{diff}$$

$$U_{ct\_raw} = U_t - \hat{U}_{ocv} - \hat{U}_s - \hat{U}_{diff}$$

$$U_{diff\_raw} = U_t - \hat{U}_{ocv} - \hat{U}_s - \hat{U}_{ct}$$

$$U_{ocv\_raw} = U_t - \hat{U}_s - \hat{U}_{ct} - \hat{U}_{diff} \qquad \text{Equation 7}$$

The impedance estimating unit 130 regards $I_{t\_raw}$ as the battery charge and discharge current signal $i_{fb}[n]$, and performs filtering on the battery charge and discharge current signal $i_{fb}[n]$ as shown in Equations 4 to 6 so as to divide it into currents as shown in Equation 8.

$$I_{FLT\_s\_raw} = \text{Filter}_s(I_{t\_raw})$$

$$I_{FLT\_ct\_raw} = \text{Filter}_{ct}(I_{t\_raw})$$

$$I_{FLT\_diff\_raw} = \text{Filter}_{diff}(I_{t\_raw}) \qquad \text{Equation 8}$$

In Equation 8, the filtering result, $I_{FLT\_s\_raw}$ corresponds to the resistance current $\hat{i}_s[n]$, $I_{FLT\_ct\_raw}$ corresponds to the charge current $\hat{i}_{ct}[n]$, and $I_{FLT\_diff\_raw}$ corresponds to the diffusion current $\hat{i}_{diff}[n]$.

Hereinafter, an estimation of parameters of the battery management system and the device for estimating an internal impedance of a battery, according to an embodiment of the present invention, will be described.

The impedance estimating unit 130 of the battery management system uses an LSE (Least Square Estimation) method so as to estimate the parameters. The impedance estimating unit 130 uses a transfer function between voltage and current so as to implement the LSE method. The transfer function is represented in Equation 9.

$$\frac{dU}{dt} = \left(i - \frac{U}{R}\right)/C \qquad \text{Equation 9}$$

$$G_C = \frac{U(s)}{i(s)} = \frac{R}{sRC+1}$$

In Equation 9, U indicates battery voltage, i indicates battery charge and discharge current, and independent variables R and C represent a resistance and a capacitance, respectively.

To use a digital filter, the continuous/discrete signal converter 120 converts the continuous domain signal into the discrete domain signal. The bilinear conversion method is used for this conversion in an embodiment of the present invention. The transfer function is represented by Equation 10.

$$s = \frac{2}{T_s} \cdot \frac{1 - Z^{-1}}{1 + Z^{-1}} \qquad \text{Equation 10}$$

$$G_D(Z^{-1}) = G_C\left(\frac{2}{T_s} \cdot \frac{1 - Z^{-1}}{1 + Z^{-1}}\right)$$

When the battery voltage discrete signal $U_{fb}[n]$ is represented as $U[n]$ and the charge and discharge current discrete signal $i_{fb}[n]$ is represented as $i[n]$, the following relationship can be expressed as Equation 11.

$$U[n] = -a_0 \cdot U[n+1] + b_0 \cdot i[n] + b_1 \cdot i[n-1] \qquad \text{Equation 11}$$

In Equation 11, since there are two independent variables R and C, Equation 11 may be represented by Equation 12, and the variables R and C may be expressed as parameters $a_0$ and $b_0$.

$$U[n] = -a_0 \cdot U[n-1] + b_0 \cdot (i[n] + i[n-1]) \qquad \text{Equation 12}$$

At this time, $$R = 2 \cdot \frac{b_0}{1 + a_0} \text{ and } C = \frac{T_s}{4} \cdot \frac{1 - a_0}{b_0} \text{ are satisfied.}$$

Equation 12 is expressed in Equation 13 by using the LSE method.

$$\hat{\theta}[n] = \hat{\theta}[n+1] + L[n] \cdot \{U[n] - \varphi^T[n] \cdot \hat{\theta}[n-1]\} \qquad \text{Equation 13}$$

At this time, $\hat{\theta}$ is the parameter to be estimated, and $\varphi^T$ is a regressor. Specifically, $\hat{\theta}$ is represented as Equation 14.

$$\hat{\theta} = [\hat{a}_0, \hat{b}_0], \varphi = [-U[n-1], i[n] + i[n-1]] \qquad \text{Equation 14}$$

L[n] from Equation 13 is represented by Equation 15.

$$L[n] = \frac{P[n-1] \cdot \varphi[n]}{1 + \varphi^T[n] \cdot p[n=1] \cdot \varphi[n]} \qquad \text{Equation 15}$$

p[n] from Equation 15 is represented in Equation 16.

$$P[n] = P[n-1] - \frac{P[n-1] \cdot \varphi[n] \cdot \varphi^T[n] \cdot p[n-1]}{1 + \varphi^T[n] \cdot p[n-1] \cdot \varphi[n]} \qquad \text{Equation 16}$$

The impedance estimating unit 130 can calculate the parameters of the battery by using Equations 10 to 16. Using Equation 17, the impedance estimating unit 130 can estimate the overvoltages.

$$\hat{U}[n] = \varphi^T[n] \cdot \hat{\theta}[n-1] \qquad \text{Equation 17}$$

In this way, the battery management system and the device for estimating an internal impedance of a battery, according to an embodiment of the present invention, divide the internal impedance of the battery into four regions using the battery equivalent circuit model, and generate the overvoltages and currents of each of the regions using the digital filters. Using the generated overvoltages and currents, it is possible to estimate the internal impedance of the battery. Further, using the estimated internal impedance of the battery, it is possible to estimate the overvoltages of each of the regions of the internal impedance.

The battery equivalent circuit model, according to an embodiment of the present invention, is set to a parallel structure of a resistor and a capacitor in a range where the error is not large. By making the battery equivalent circuit less complex, it is possible to obtain overvoltages in real time. In the conventional method of estimating the parameters of the battery, the amount of calculation increases as the number of state variables of the model increases. Further, in the conventional method, when the number of state variables decreases so as to reduce the complexity and amount of calculation, the error of estimating the overvoltages increases. Therefore, using the method of estimating the internal impedance in the battery equivalent model according to an embodiment of the present invention allows a reduction the error of estimating the overvoltages and estimation of the internal impedance of the battery in real time.

Hereinafter, a result comparing the use of the battery management system, the method of driving the same, and the device for estimating an internal impedance of a battery, according to an embodiment of the present invention, to measurements obtained by experiment will be described.

Figure 8:
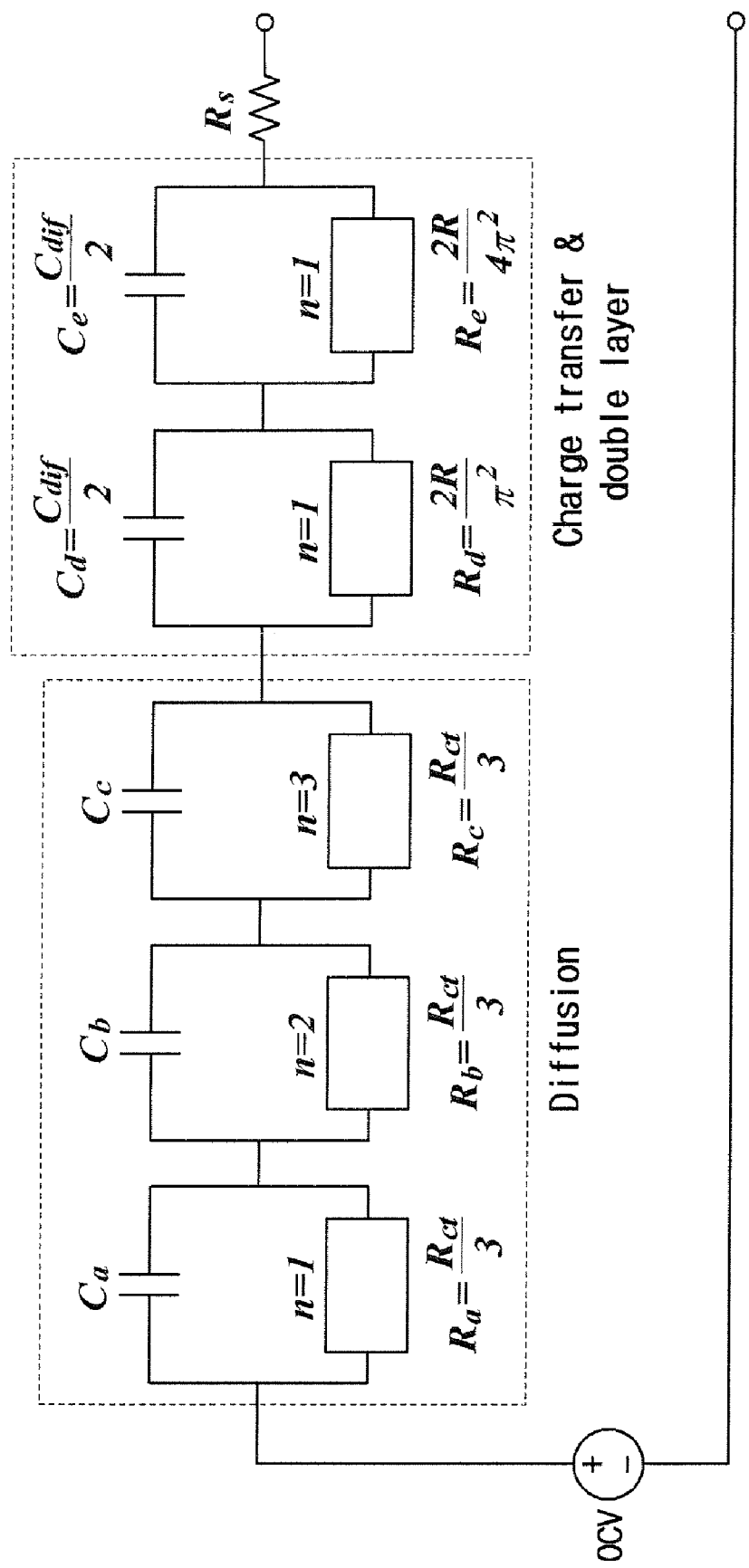
FIG. 8 is a diagram illustrating a battery equivalent circuit model by using a battery impedance spectrum obtained by EIS equipment.

FIG. 8 is a diagram illustrating an equivalent circuit model (hereinafter, referred to as "impedance model") of a battery by using a battery impedance spectrum obtained by EIS equipment. In Table 2, parameters that are extracted from the equivalent circuit model in FIG. 8 are shown.

TABLE 2

| Name  | $R_{ct}$   | $C_{dl}$   | $R_a$ | $R_b$ | $R_c$ | $C_a$  | $C_b$  | $C_c$  |
|-------|------------|------------|-------|-------|-------|--------|--------|--------|
| Value | 27.6       | 0.5693     | 9.1   | 9.1   | 9.1   | 0.1011 | 0.5056 | 2.5281 |
| Name  | $R_{diff}$ | $C_{diff}$ | $R_d$ | $R_e$ | $C_d$ | $C_e$  |        | $R_s$  |
| Value | 39.6       | 3454       | 25.2  | 6.3   | 1727  | 1727   |        | 40     |

All capacitances in Farads (F) and resistances in milliohms (mΩ).

The portion of the charge transfer overvoltage (charge transfer and double layer) has a structure of two RC parallel ladders connected in series. When the number of RC parallel ladders connected in series increases, the accuracy of calculation is improved. However, since the amount of calculation also increases, simulation takes additional time. Therefore, the two RC parallel ladders within an allowable error range are connected in series. The diffusion overvoltage portion includes a large series capacitor corresponding to an open circuit voltage OCV and RC parallel ladders.

Next, verification and result of this algorithm will be described by using a short-term simulation result for 100 seconds.

Figure 10:
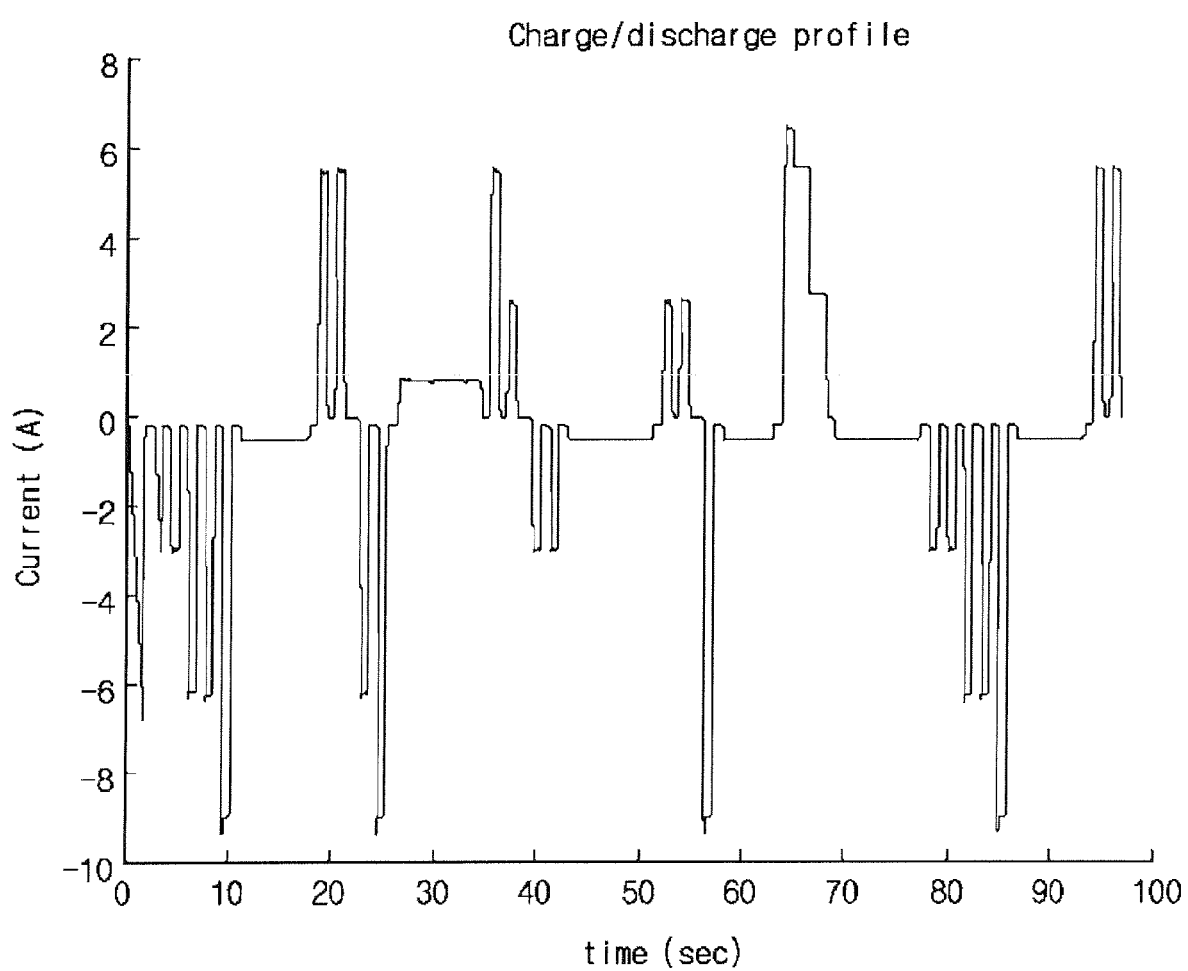
FIG. 10 is a graph showing a charge and discharge waveform that is used for the simulation.

FIG. 10 shows a charge and discharge waveform that is used for the simulation.

Figure 11:
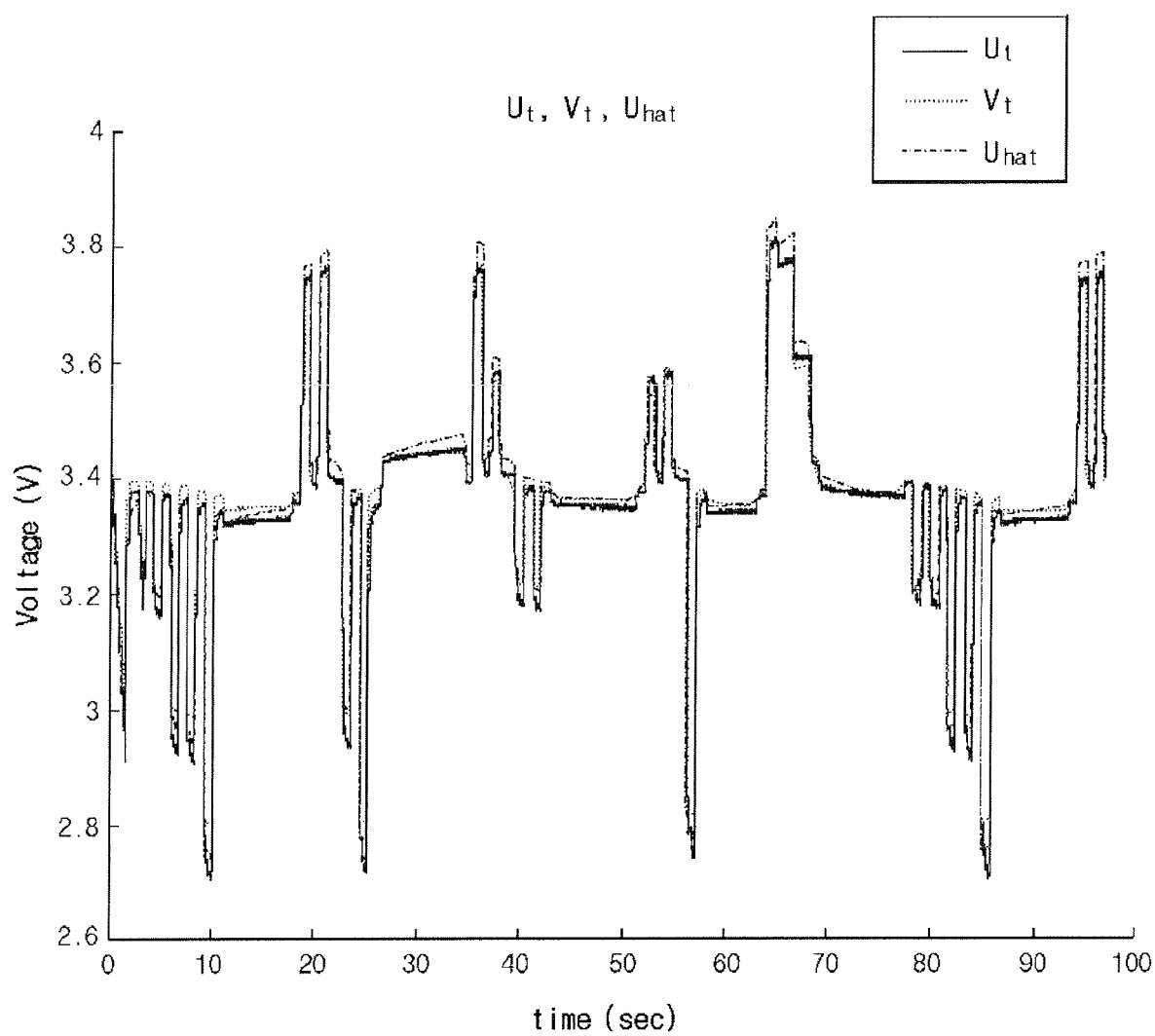
FIG. 11 is a graph showing a measured battery terminal voltage Ut, an impedance model terminal voltage Vt, and an estimation model terminal voltage Uhat.

FIG. 11 shows a measured battery terminal voltage Ut, an impedance model terminal voltage Vt, and an estimation model terminal voltage Uhat. The impedance model terminal voltage Vt is obtained by measurement through an actual step response test. The estimation model terminal voltage Uhat is a voltage measurement generated by extracting each parameter from the estimation model through the digital filter.

The impedance model terminal voltage Vt and the estimation model terminal voltage Uhat are both shown on FIG. 11 with the actual measured battery terminal voltage Ut.

FIG. 11 shows that the battery management system, the method of driving the same, and the device for estimating an internal impedance of a battery, according to an embodiment of the present invention, can accurately estimate the internal impedance of the battery in real time. That is, without changing the current state of the battery, embodiments of the present invention make it is possible to estimate the internal impedance of the battery. The internal impedance component of the battery is closely related to the SOC (state of charge) and the SOH (state of health) of the battery. When the internal impedance of the battery is accurately estimated according to the battery management system, the method of driving the same, and the device for estimating an internal impedance of a battery, according to an embodiment of the present invention, the SOC and the SOH can also be estimated more accurately and performance of the battery thereby improved.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

According to an embodiment of the present invention, a battery management system, a method of driving the same, and a device for estimating an internal impedance of a battery that can estimate an internal impedance of a battery in real time are provided. Further, since the internal impedance of the battery is estimated using a digital filter, the battery management system, the method of driving the same, and the device for estimating an internal impedance of a battery can estimate the internal impedance of the battery without affecting the SOH of the battery. Further still, the battery management system, the method of driving the same, and the device for estimating an internal impedance of a battery that can estimate the SOC and the SOH of a battery accurately using the measured internal impedance.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of driving a battery management system that estimates an internal impedance of a battery including a plurality of cells, the method comprising:
generating a battery equivalent model of the battery;
receiving a terminal voltage signal and a charge and discharge current signal of the battery;
generating a first discrete signal corresponding to the terminal voltage signal of the battery;
generating a second discrete signal corresponding to the charge and discharge current signal of the battery;
estimating the internal impedance of the battery by filtering the first discrete signal and the second discrete signal according to a frequency range corresponding to the battery equivalent model; generating a third discrete signal by filtering the first discrete signal according to the frequency range corresponding to the battery equivalent model; and generating a fourth discrete signal by filtering the second discrete signal according to the frequency range corresponding to the battery equivalent model,
wherein the generating of the battery equivalent model comprises:
calculating a first parameter, which represents a resistance overvoltage corresponding to the internal impedance of the battery;
calculating a second parameter, which represents a charge transfer overvoltage;
calculating a third parameter, which represents a diffusion overvoltage; and
calculating a fourth parameter, which represents an open circuit voltage;
dividing the first to fourth parameters according to a frequency domain; and the estimating of the internal impedance of the battery further comprises:
filtering the first parameter by using a high-pass filter,
filtering the second parameter by using a band-pass filter, and filtering the third and fourth parameters by using a low-pass filter.

2. The method of claim 1, wherein the estimating of the internal impedance further comprises:
using a bilinear conversion method to generate the first to fourth discrete signals.

3. The method of claim 1, wherein the battery equivalent model comprises:
a first capacitor and a first resistor connected in parallel to represent a charge transfer impedance of the battery;
a second capacitor and a second resistor connected in parallel to represent a diffusion impedance of the battery;
a third resistor to represent a series resistance impedance of the battery; and
an open circuit voltage component to represent an open circuit voltage of the battery.

4. The method of claim 1, further comprising:
dividing the first to fourth parameters according to a frequency domain; and
estimating of the internal impedance further comprises:
filtering the first parameter by using a high-pass filter; and
filtering the second, third, and fourth parameters by using a low-pass filter.

5. The method of claim 1, further comprising:
estimating the first to fourth parameters by using the third discrete signal and the fourth discrete signal; and
estimating a resistor and a capacitor that correspond to the internal impedance of the battery by using the first to fourth parameters.

6. The method of claim 5, further comprising:
estimating the first to fourth parameters by using the third discrete signal and the fourth discrete signal by using a least square estimation method.

7. A battery management system that estimates an internal impedance of a battery including a plurality of cells, the system comprising:
an anti-aliasing low-pass filter that receives a battery terminal voltage signal and a battery terminal current signal and removes aliasing of the battery terminal voltage signal and the battery terminal current signal so as to generate a first signal and a second signal;
a continuous/discrete signal converter that converts the first signal and the second signal from the anti-aliasing low-pass filter into discrete signals according to a sampling time, and thereby generates a first discrete signal corresponding to the first signal and a second discrete signal corresponding to the second signal; and
an impedance estimating unit that estimates the internal impedance of the battery by filtering the first and the second discrete signals according to a frequency range corresponding to a battery equivalent model of the battery,
wherein the impedance estimating unit further:
generates a third discrete signal by filtering the first discrete signal and a fourth discrete signal by filtering the second discrete signal according to the frequency range corresponding to the battery equivalent model of the battery;
estimates the internal impedance of the battery by using a third discrete signal and a fourth discrete signal,
wherein the battery equivalent model includes four parameters, each of which corresponds to the internal impedance of the battery, the four parameters comprising:
a first parameter, which represents resistance overvoltage;
a second parameter, which represents a charge transfer overvoltage;
a third parameter, which represents a diffusion overvoltage; and
a fourth parameter, which represents an open circuit voltage; and
wherein the impedance estimating unit:
divides the four parameters according to a frequency domain; and
filters the first parameter by using a high-pass filter;
filters the second parameter by using a band-pass filter; and
filters the third and the fourth parameters by using a low-pass filter.

8. The system of claim 7, wherein the impedance estimating unit further:
estimates the four parameters by using the third discrete signal and the fourth discrete signal; and
estimates a resistor and a capacitor that correspond to the internal impedance of the battery using the four parameters.

* * * * *